US009136854B1

(12) United States Patent
Hong

(10) Patent No.: US 9,136,854 B1
(45) Date of Patent: Sep. 15, 2015

(54) CURRENT SWITCHING DIGITAL-TO-ANALOG CONVERTER WITH HYBRID CURRENT SWITCHING CIRCUIT HAVING LOW-MEMORY EFFECT

(71) Applicant: Cadence Design Systems, Inc., San Jose, CA (US)

(72) Inventor: Sung-Hwan Hong, Saint-Laurent (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/445,054

(22) Filed: Jul. 29, 2014

Related U.S. Application Data

(60) Provisional application No. 62/019,257, filed on Jun. 30, 2014.

(51) Int. Cl.
| *H03M 1/66* | (2006.01) |
| *H03M 1/06* | (2006.01) |
| *H03M 1/00* | (2006.01) |
| *H03M 1/70* | (2006.01) |
| *H03M 1/74* | (2006.01) |

(52) U.S. Cl.
CPC .......... *H03M 1/0619* (2013.01); *H03M 1/002* (2013.01); *H03M 1/66* (2013.01); *H03M 1/70* (2013.01); *H03M 1/742* (2013.01); *H03M 1/745* (2013.01)

(58) Field of Classification Search
CPC ....... H03M 1/742; H03M 1/66; H03M 1/745; H03M 1/002; H03M 1/70
USPC .................................. 341/144; 327/307, 308
See application file for complete search history.

(56) References Cited

U.S. PATENT DOCUMENTS

| 5,420,529 | A  | * | 5/1995  | Guay et al. ..................... 326/115 |
| 5,870,044 | A  | * | 2/1999  | Dell'ova et al. ............... 341/120 |
| 6,417,793 | B1 | * | 7/2002  | Bugeja et al. ................. 341/144 |
| 6,720,898 | B1 | * | 4/2004  | Ostrem ......................... 341/144 |
| 8,928,512 | B2 | * | 1/2015  | Yuan et al. .................... 341/144 |

* cited by examiner

*Primary Examiner* — Brian Young
(74) *Attorney, Agent, or Firm* — Schwegman Lundberg & Woessner, P.A.

(57) ABSTRACT

In one embodiment of the invention, a digital to analog convertor (DAC) is disclosed for converting a digital input signal into an analog output signal. The DAC includes a switch controller coupled to a digital input signal; a bias voltage generator coupled to a first terminal of an analog voltage power supply; and a switched current source array coupled to the switch controller and the bias voltage generator. The bias voltage generator generates a bias voltage. The switch controller generates a plurality of digital enable signals. The switched current source array includes a plurality of hybrid switched current cells coupled to the switch controller and the bias voltage generator. The plurality of hybrid switched current cells are coupled together at an analog output terminal to sum unit currents together, if any, and form the analog output signal in response to the digital input signal.

21 Claims, 9 Drawing Sheets

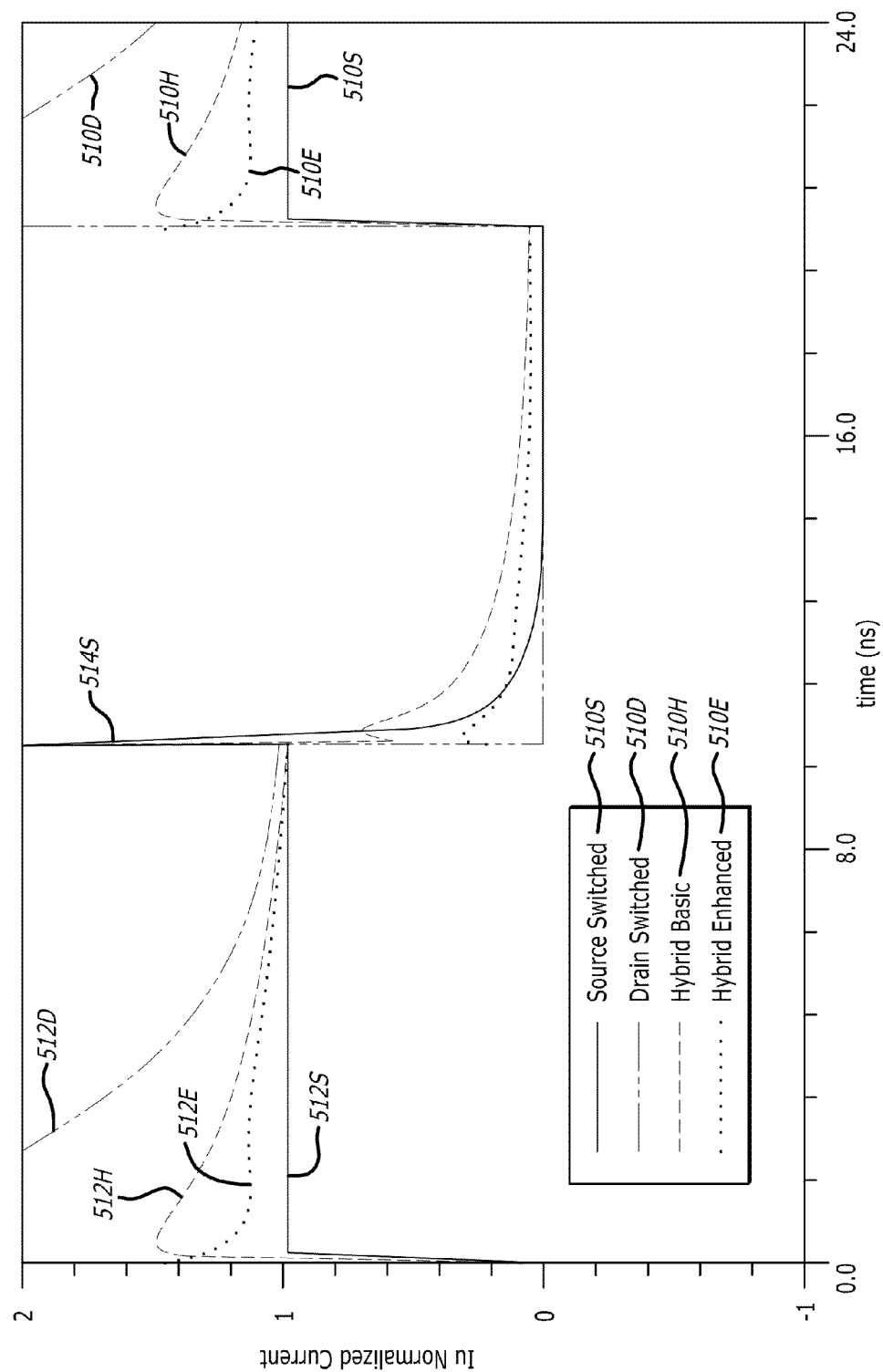

CURRENT SWITCHING DIGITAL-TO-ANALOG CONVERTER WITH HYBRID CURRENT SWITCHING CIRCUIT HAVING LOW-MEMORY EFFECT

CLAIM OF PRIORITY

This application claims the benefit of priority under 35 U.S.C. §119(e) to U.S. Provisional Patent Application Ser. No. 62/019,257, filed on Jun. 30, 2014, the benefit of priority of which is claimed hereby, and which is incorporated by reference herein in its entirety.

FIELD

The embodiments of the invention relate generally to digital to analog converters (DAC).

BACKGROUND

A conventional digital to analog converter (DAC) employs circuit cells that use a simple switched current mirror approach. This simple and effective approach is efficient at generating high-precision static output current values representing the analog output at low frequencies of digital input signal changes. However, the same circuit may behave differently when stepped dynamically at high rates or frequencies (e.g., gigahertz (GHz) frequencies) of digital input signal changes. At higher rates or frequencies, the analog output of the conventional DAC circuit cell is often distorted.

For example, a triangular analog output (voltage or current) waveform pattern may be generated from a simple conventional DAC by a repeating stair step up and down pattern of digital input signals. At low speeds switching frequencies (almost DC) of the digital input signal, the output from the conventional DAC has an ideal stair-case type output current profile, with each step being equal. However, oftentimes when the conventional DAC is stepped at faster rates, a memory effect occurs. With the memory effect, the next output DAC step size depends on the pattern of the previous steps of output. Instead of the DAC having a linear output with respect to the digital input, the analog output of the conventional DAC becomes non-linear, varying with the switching speeds of the digital input signal. Even if the digital input signal is monotonically switched at the same frequency, the higher frequency switching speeds show how the memory effect can distort the analog signal output.

There are a few conventional ways to overcome the memory effect in a DAC. One conventional way is to add substantial capacitance to the output of a bias circuit to minimize voltage spikes from charge injection on a bias voltage coupled to the DAC circuit cells. A disadvantage to adding capacitance is that it consumes significant surface area of an integrated circuit increasing die size and increasing per die costs of a semiconductor wafer. Increased die size lowers potential profits of an integrated circuit.

Another conventional method is to use current steering circuit cells that steer currents between the analog output and a dummy load instead of the circuit cell that switches currents on and off into the analog output. The current steering circuit cell in the DAC minimizes charges that may be injected back into the biasing circuit and the bias voltage. However, current steering circuit cells are disadvantageous because they constantly consume power and are thus not power efficient. Accordingly, current steering circuit cells that steer current are costly due to power consumption and are not useful in low-power DAC applications.

Thus, conventional methods of improving frequency response of a DAC are costly due to increased die size or increased power consumption. It is desirable to improve the DAC current switching cell design over that of the prior art for use at higher frequencies of digital input signal changes.

BRIEF SUMMARY

The embodiments of the invention are best summarized by the claims that follow below. However briefly, a digital to analog converter (DAC) is disclosed with a plurality of hybrid switched current cells coupled in parallel between the analog voltage supply and the analog output. Each hybrid switched current cell includes a source switched series circuit coupled in parallel with a drain switched series circuit that are switched in response to an enable signal from the switch controller. When switched ON by the enable signal, each of the source switched series circuit and the drain switched series circuit contributes current that is summed together to form the output unit current from the hybrid switched current cell. The source switched series circuit and the drain switched series circuit are complimentary of each other and minimize the memory effect across process, temperature, and voltage variations.

BRIEF DESCRIPTIONS OF THE DRAWINGS

The following is a brief description of the drawings. Like reference numbers in the drawings may indicate similar functional elements.

FIG. 5 illustrates current waveform diagrams of output currents of an ON-OFF-ON sequence for a source switched current cell, a drain switched current cell, a hybrid switched current cell, and an enhanced hybrid switched current cell with transistor size (e.g., width and/or length) being adjusted to further improve compensation.

DETAILED DESCRIPTION

In the following detailed description of the embodiments of the invention, numerous specific details are set forth in order to provide a thorough understanding of the present invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The embodiments of the invention include a method, apparatus and system for digital to analog converters with a plurality of hybrid switched current cells composed of a drain-switched or current switched leg in parallel with a source-switched or voltage-switched leg.

DACS with PFET Hybrid Switched Current Cells

Figure 1A:
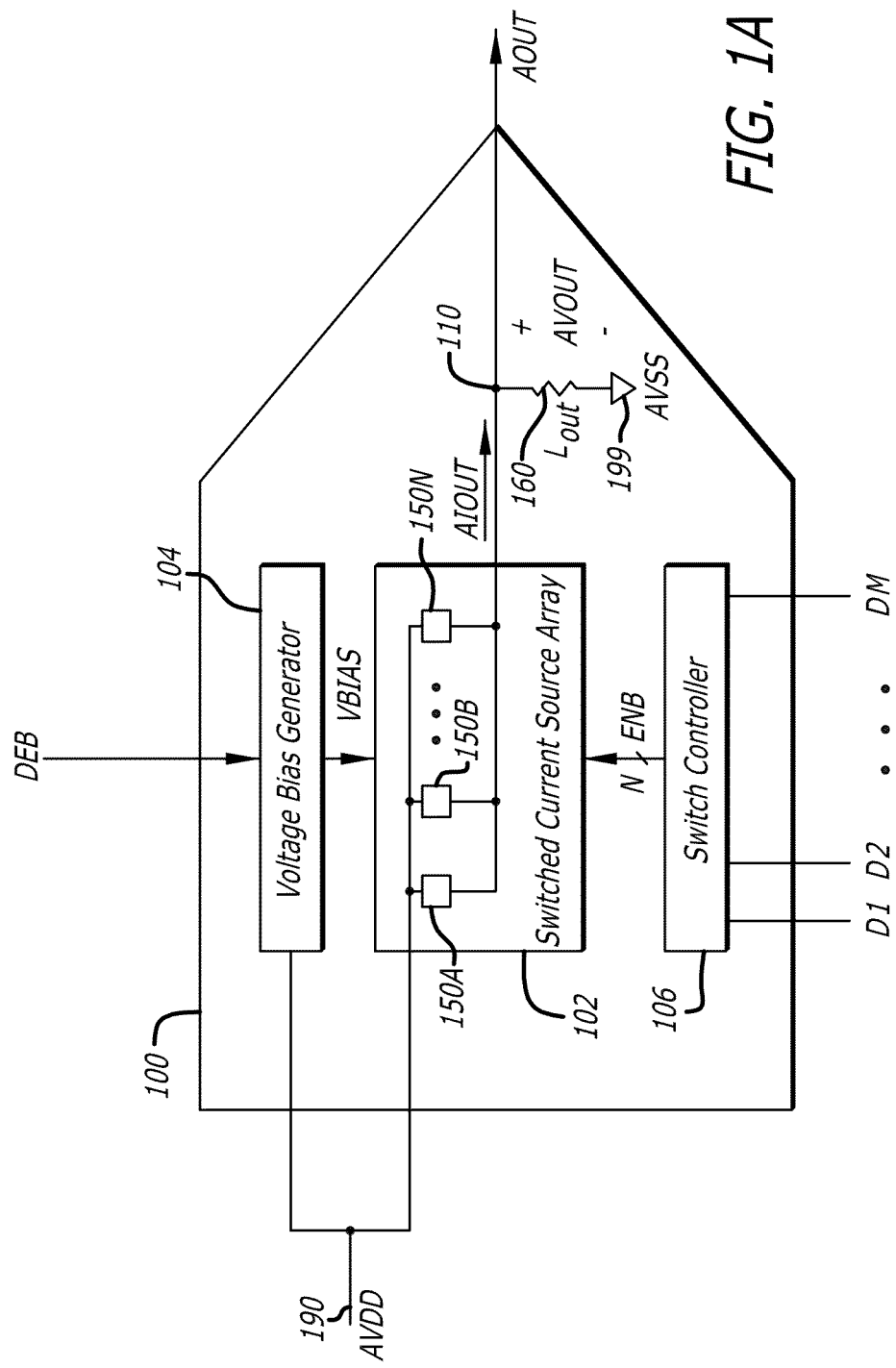
FIG. 1A is a functional block diagram of a digital to analog converter (DAC) utilizing a plurality of hybrid switched current cells formed of P-channel transistors.

Referring now to FIG. 1A, a current switching DAC 100 is shown. The DAC 100 utilizes a plurality of hybrid switched current cells 150A-150N formed of P-channel transistors. The digital to analog convertor (DAC) 100 converts a digital input signal Din of a plurality of M bits (Dl through DM) at the input to a switch controller 106 into an analog output signal on an analog output terminal 110. The current switching DAC 100 includes a switched current source array 102, a voltage bias generator 104, and a switch controller 106 coupled together as shown. The switched current source array 102 is coupled to the switch controller 106 and the bias voltage generator 104. The DAC 100 may receive upper and lower analog power supply voltages (AVDD,AVSS) and upper and lower digital power supply voltages (VDD,VSS).

The switched current source array 102 includes a plurality of N hybrid switched cells 150A-150N where the value of N may be equal to two to the power of M less one (N=$2^M$−1). The plurality of N hybrid switched cells 150A-150N are coupled to the switch controller 106 to receive N enable signals (enb1-enbN). The plurality of hybrid switched cells 150A-150N are coupled to the bias voltage generator 104 to receive a bias voltage VBIAS. The plurality of hybrid switched cells 150A-150N have one terminal that is coupled together at the analog output terminal 110. Another terminal of the plurality of hybrid switched cells 150A-150N is coupled together at a terminal of an analog voltage power supply AVDD 290. The plurality of hybrid switched cells 150A-150N form the analog output signal (an analog current signal or an analog voltage signal) at the analog output terminal AOUT 110 in response to the digital input signal Din.

The switch controller 106 is coupled to the digital input signal Din to receive the bits of the digital signal to convert into an analog signal. The switch controller 106 is typically coupled to the digital power supply (VSS,VDD) to generate the switch control signals for the switched current source array 102. The switch controller 106 generates a plurality of digital switch control signals (ENB for p-channel transistors or EN for n-channel transistors) in response to the digital input signal Din.

The bias voltage generator 104 is coupled to a first terminal of the analog voltage power supply AVDD 190 and the plurality of hybrid switched cells 150A-150N. The bias voltage generator 104 is used to generate a bias voltage VBIAS in response to the analog voltage power supply that is explained further herein with reference to FIGS. 3A-3B.

As mentioned previously, the switched current source array 102 includes a plurality of hybrid switched cells 150A-150N. Each of the plurality of hybrid switched cells 150A-150N includes a drain switched transistor (also referred to herein as a current switching transistor because it selectively switches a current ON/OFF) in a leg of a circuit and a source switched transistor (also referred to herein as a voltage switching transistor because its selectively switches a power supply voltage ON/OFF) in a parallel leg of the circuit. Each of the current switching transistor and the voltage switching transistor has gate terminals coupled together and to a respective one of the plurality of digital enable signals. Each of the plurality of hybrid switched cells further includes a first biased current source transistor coupled to the current switching transistor. A current of the first biased current source transistor is selectively switched by the current switching transistor in response to the digital enable signal. Each of the plurality of hybrid switched cells further includes a second biased current source transistor coupled to the voltage switching transistor. A source voltage coupled into the second biased current source transistor is selectively switched by the voltage switching transistor in response to the digital enable signal.

The DAC 100 may optionally include an output load; for example, an output load Lout 160 coupled between the analog output terminal AOUT 110 and a second terminal of the analog voltage power supply (e.g., AVSS 199). The output load Lout 160 may be a resistor that is used to generate an analog voltage output signal AVOUT in response to the analog current output signal AIOUT generated by the switched current source array 102. Alternatively, the output load Lout 160 can be a complex circuit such as a current-starved ring-oscillator that generates an oscillating output whose frequency is proportional to the analog current output signal AIOUT generated by the switched current source array 102.

Figure 2A:
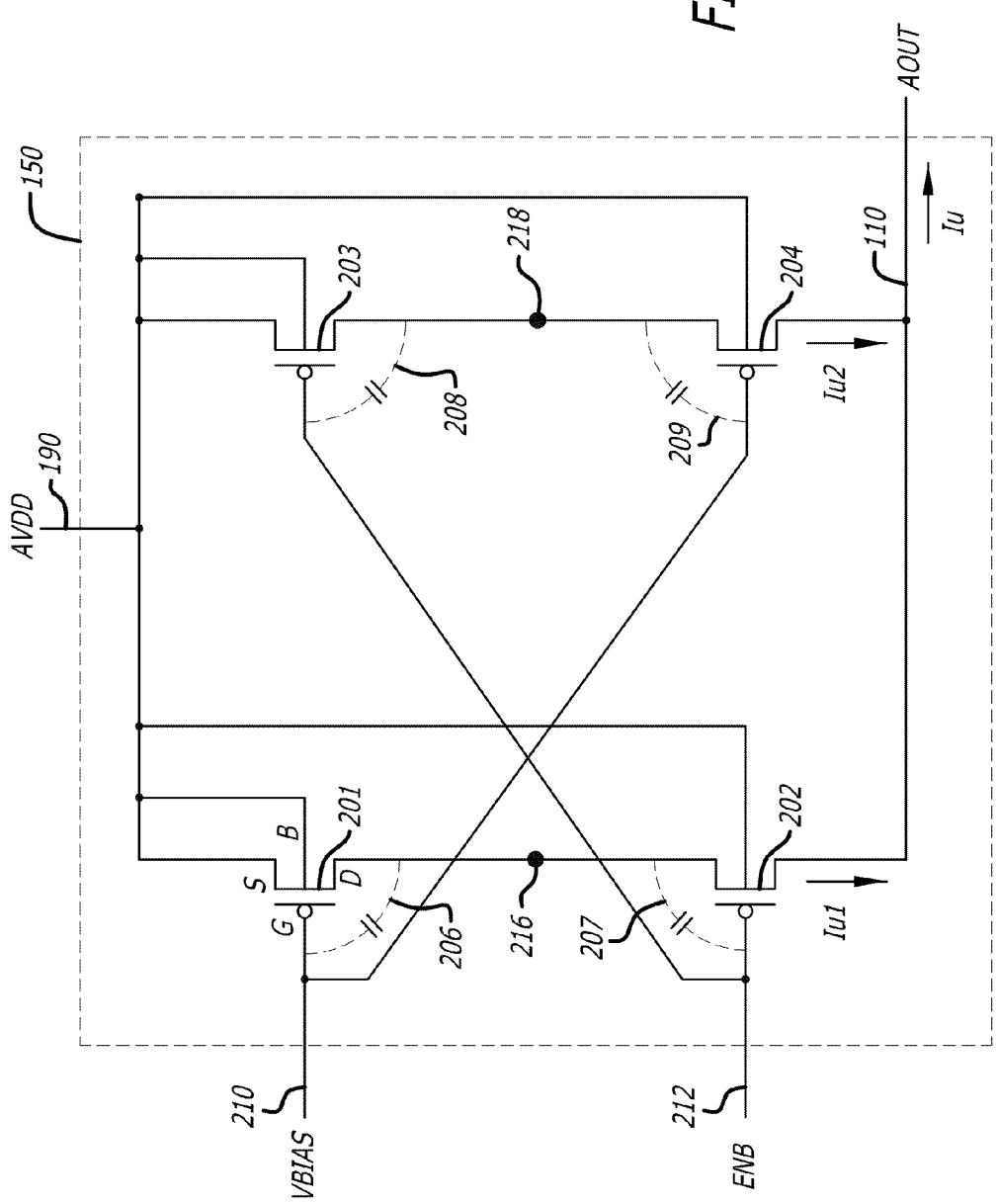
FIG. 2A is a schematic diagram of a hybrid switched current cell formed of P-channel transistors.

Referring now to FIG. 2A, a hybrid switched current cell 150 is formed of P-channel field effect transistors (PFETs) each having a gate terminal (G), a source terminal (S), a drain terminal (D), and a bulk or substrate terminal (B). The hybrid switched current cell 150 is instantiated multiple times to form the plurality of hybrid switched current cells 150A-150N for the DAC 100.

The hybrid switched current cell 150 includes a source switched series circuit coupled in parallel with a drain switched series circuit that are switched in response to an enable signal ENB from the switch controller 106. The drain switched series circuit includes PFETs 201-202 coupled in series together. The source switched series circuit includes the PFETs 203-204 coupled in series together.

PFET 201 of the drain switched series circuit has a source terminal S coupled to the analog power supply voltage AVDD 190, a gate terminal G coupled to the bias voltage VBIAS 210, and a drain terminal D coupled to the source terminal S of the PFET 202 at node 216. PFET 202 has a source terminal S coupled to the drain terminal D of the PFET 201 at node 216, a gate terminal G coupled to the enable digital signal ENB 212, and a drain terminal D coupled to the analog output terminal AOUT 110. The bulk or substrate terminal B of the PFETs 201-202 are coupled to the analog power supply voltage terminal AVDD 190.

PFET 203 of the source switched series circuit has a source terminal S coupled to the analog power supply voltage AVDD 190, a gate terminal G coupled to the enable digital signal ENB 212, and a drain terminal D coupled to the source terminal S of the PFET 204 at node 218. PFET 204 has a source terminal S coupled to the drain terminal D of the PFET 203 at node 218, a gate terminal G coupled to the bias voltage VBIAS 210, and a drain terminal D coupled to the analog output terminal AOUT 110. The bulk or substrate terminal B of PFETs 203-204 is coupled to the analog power supply voltage terminal AVDD 190.

In the drain switched series circuit, the PFET 201 is biased by the bias voltage VBIAS 210 to provide a first portion of unit current (Iu1) of a current source in a bias circuit to the drain terminal D of the PFET 202. The PFET 202 is selectively switched ON by the enable digital signal ENB 212 coupled to its gate terminal G. When selectively switched ON, the PFET 202 provides the first portion of unit current from the PFET 201 to the analog output terminal AOUT 110 in response to the enable digital signal ENB 212.

In the source switched series circuit, the PFET 203 is selectively switched ON by the enable digital signal ENB 212 coupled to its gate terminal G. When selectively switched ON, the PFET 203 provides the analog power supply voltage AVDD 290 to the source terminal S of the PFET 204 in response to the enable digital signal ENB 212. The PFET 204 is biased ON by the bias voltage VBIAS 210 coupled to its gate terminal G. The PFET 204 selectively provides a second portion of unit current (Iu2) of the current source in the bias circuit to the analog output terminal AOUT 110 in response to receiving the analog power supply voltage AVDD from the drain terminal D from the PFET 203.

When switched ON by the enable digital signal ENB, the first portion of unit current (Iu1) from the drain switched series circuit and the second portion of unit current (Iu2) from the source switched series circuit that are coupled together in parallel are summed together at the analog output node 110 out of the hybrid cell 150 to form a full unit of current (Iu) from the cell.

The size and width-to-length ratio of the PFETS 201-204 in the hybrid switched current cell 150 are usually of equal size. The widths/lengths of the PFET 201 and PFET 204 may be equal, and similarly, the widths/length of the PFET 202 and PFET 203 may be equal such that the first portion of unit current (Iu1) and the second portion of unit current (Iu2) are approximately equal. Each of the first portion of unit current and the second portion of unit current are about one half unit of current so that a full unit of current (Iu) is formed at the analog output node 110.

The hybrid switched current cell 150 may be enhanced by altering the equal width/length sizing of transistors between the source switched series circuit and the drain switched series circuit. The widths (and/or lengths) of the transistors in the source switched series circuit may be a ratio to the widths (and/or lengths) of the transistors in the drain switched series circuit.

The charge injection on VBIAS contributed by PFET 201 and PFET 204 is complimentary but not equal. The net difference of injection manifests as a disturbance (a glitch or spike) in the voltage on VBIAS 210. The sizing and ratio of the PFET 201 and PFET 204 affects the net charge injection on the net VBIAS 210. By carefully choosing the ratio of sizes between the PFET 201 and the PFET 204 in the hybrid switched DAC cell 150, the net charge injected to VBIAS 210 can be minimized further, and hence reduce the memory effect or distortion at the output.

The width/length of the PFET 204 to the width/length of the PFET 201 may be a ratio greater than one in the hybrid switched current cell 150. For example, the width of PFET 204 may be twice the width of PFET 201. Accordingly to this example, the drain switched series circuit may switch approximately two-thirds of the unit current while the source switched series circuit may switch approximately one-third of the unit current such that a full unit of current is formed at the analog output node 110.

Figure 3A:
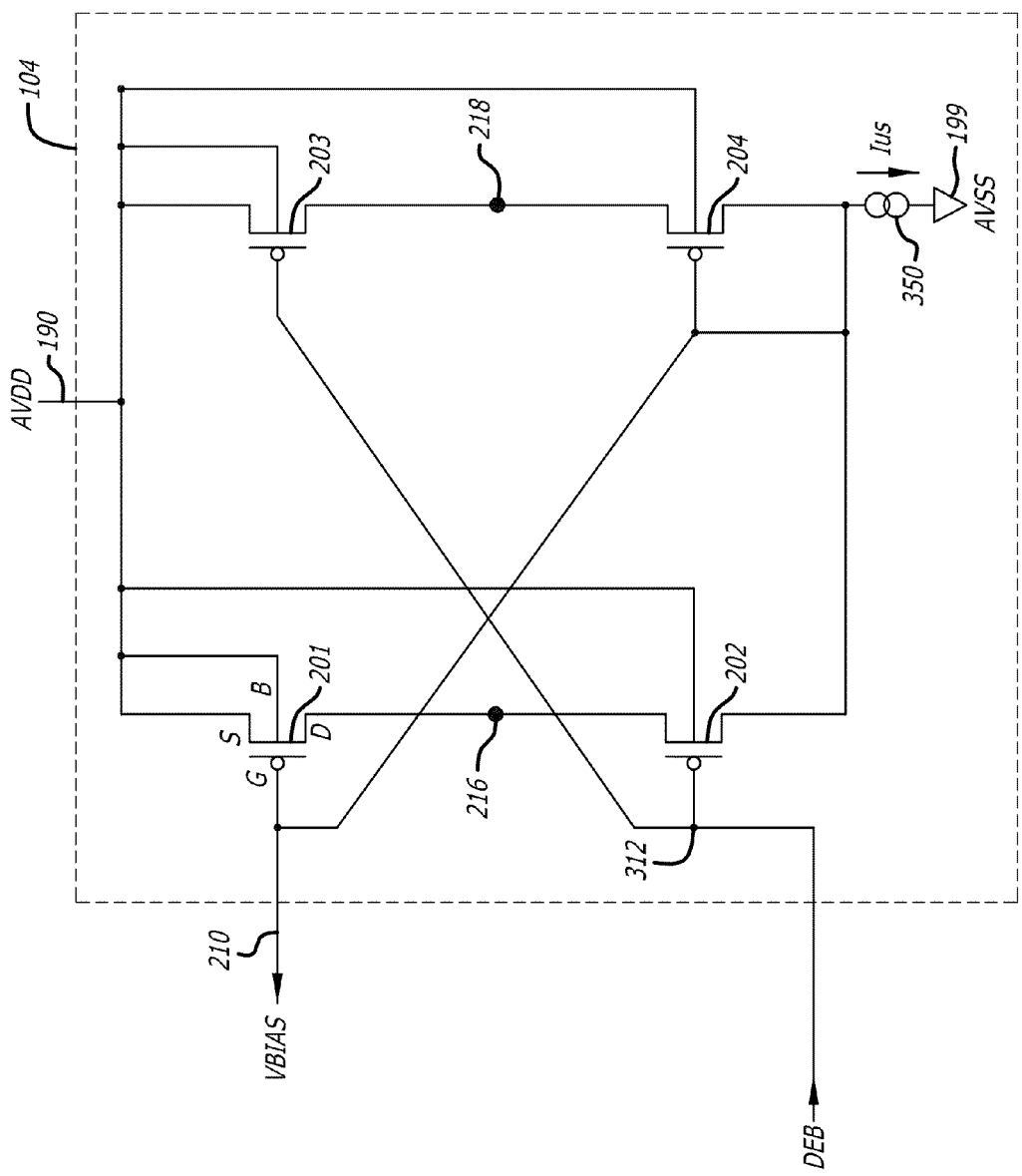
FIG. 3A is a schematic diagram of a bias voltage generator circuit for the DAC of FIG. 1A and the hybrid switched current cell of FIG. 2A.

Referring now to FIG. 3A, a voltage bias generator circuit 104 is illustrated. The voltage bias generator circuit 104 has the same configuration of PFET transistors 201-204 as found in the hybrid switched current cell 150 but with some terminals coupled differently as shown. The voltage bias generator circuit 104 further includes a DAC disable signal DEB 312 coupled to the gates G of the PFETS 202-203 to selectively turn the bias generator ON and OFF. The voltage bias generator circuit 104 further includes a current source 350 that generates a unit of current (Ius) that may be mirrored by the hybrid cell 150 as the unit of current (Iu) out from the cell.

The voltage bias generator circuit 104 includes a first series circuit including PFETs 201-202 coupled in series together and a second series circuit including PFETs 203-204 coupled in series together. The first series circuit and the second series circuit are coupled in parallel between the analog power supply AVDD 190 and node 210.

The gate terminals G of the PFET 201 and PFET 204 are coupled together and to the bias voltage output terminal VBIAS 210. The drain terminals D of the PFET 202 and PFET 204 are coupled together and to the bias voltage output terminal VBIAS 210. This sets up the PFET 204 into a diode configuration with its gate terminal G and drain terminal D coupled together. When the PFET 202 is turned ON by the DAC disable signal DEB 312 being active low, the PFET 201 is effectively configured into a diode configuration with its gate terminal and drain terminal D coupled together through the source-drain resistance of PFET 202.

The gate terminals G of the PFET 202 and PFET 203 are coupled together and selectively controlled by the DAC disable signal DEB to turn the bias generator ON/OFF. It is desirable to turn the bias generator OFF to control leakage in a powered down mode. To turn the bias voltage generator 104 OFF, the DAC disable signal DEB is logically high such that PFETs 202-203 are turned OFF, the voltage bias generator circuit 104 is powered down, and current does not leak through the current source 350. To turn the bias voltage generator 104 ON, the DAC disable signal DEB is driven to logically low level. In this case, the PFET 202 and PFET 203 are turned ON and the voltage bias generator circuit 104 generates the bias voltage VBIAS.

The current source 350 has one terminal coupled to the bias voltage output terminal VBIAS 210 and another terminal coupled to the analog power supply voltage AVSS 350. The current source 350 may be formed in a number of well known ways to form the reference current Ius. The current source 350 may be formed by a simple resistor or a more complex current source circuit.

Figure 4A:
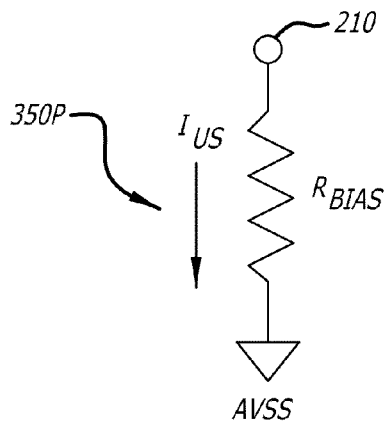
FIGS. 4A-4B are schematic diagrams of exemplary passive current sources for use with the bias voltage generator circuits shown in FIGS. 3A-3B.
Figure 4B:
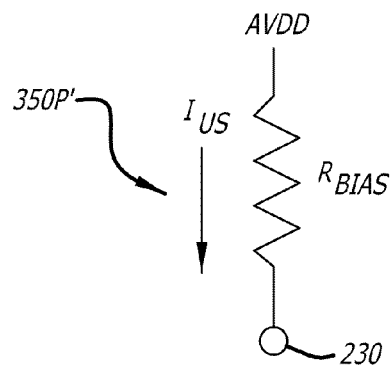
Figure 4C:
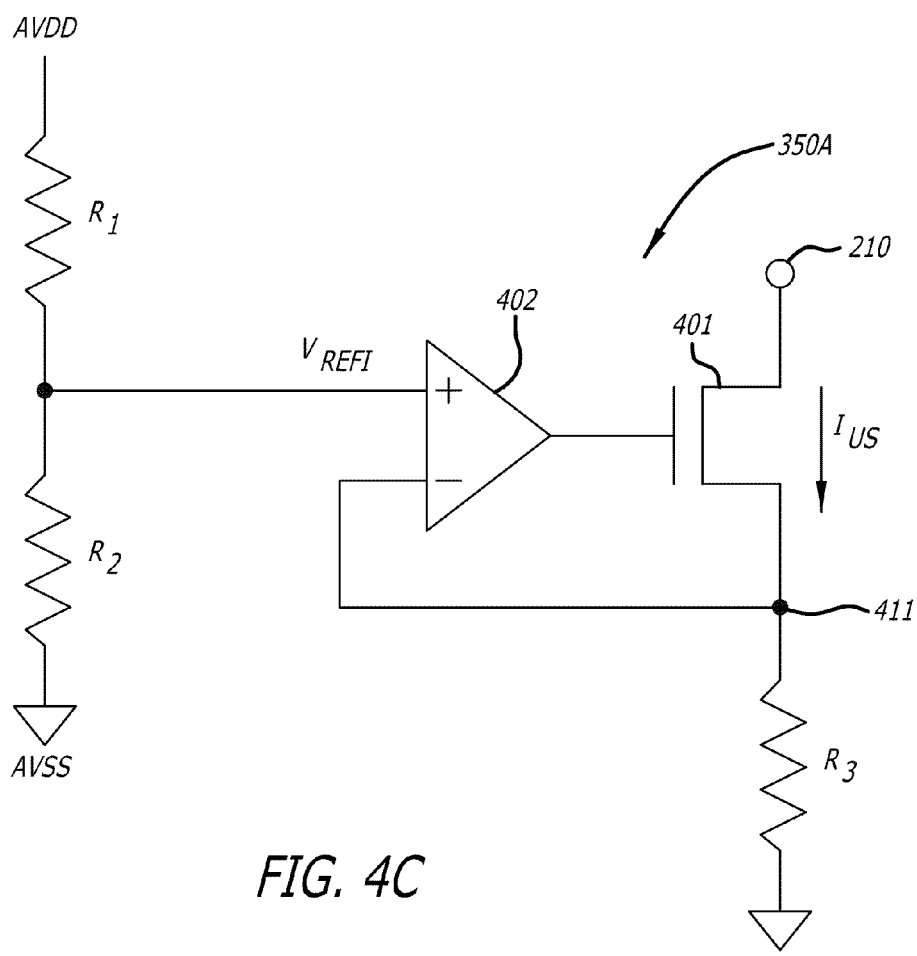
FIG. 4C is a schematic diagram of an exemplary active current source for use with the bias voltage generator circuit shown in FIG. 3A.

Referring now to FIGS. 4A-4C, schematic diagrams of exemplary current sources 350A,350P,350P' are shown that may be used as the current source 350 in the bias voltage generator circuit 104. Other known current sources may alternatively be used, such as a constant-gm current source or a band-gap reference current source, for example.

In FIGS. 4A-4B, passive current sources 350P,350P' are shown. The passive current source 350P is a resistor Rbias coupled between the lower analog voltage power supply terminal AVSS 199 and the bias voltage terminal 210. The passive current source 350P' is a resistor Rbias coupled between the upper analog voltage power supply terminal AVDD 190 and the bias voltage terminal 230.

In FIG. 4C, an active current source 350A is shown. The active current source 350A includes a plurality of resistors R1,R2,R3; an analog amplifier or operational amplifier (OPAMP) 402; and an NFET 401 coupled together as shown.

The resistors R1 and R2 are coupled in series together between the lower analog voltage power supply terminal AVSS 199 and the upper analog voltage power supply terminal AVDD 190. Through voltage division, the resistors R1 and R2 can form a reference voltage VREFI that is coupled to the positive input terminal of the OPAMP 402.

The NFET 401 has its gate terminal G coupled to the output of the OPAMP 402. That drain terminal of the NFET 401 is coupled to the bias voltage terminal 210 while the source terminal of the NFET 401 is coupled to one terminal of the resistor R3 at node 411. The second terminal of the resistor R3 is coupled to the lower analog voltage power supply terminal AVSS 199. The voltage on node 411 across the resistor R3 is coupled to the negative input terminal of the OPAMP 402.

The voltage on node 411 and the voltage reference VREFI are used by the OPAMP 402 to generate a gate voltage for the gate G of the NFET 401 to maintain a desired level of current Ius. The resistors R1,R2,R3 may be sized to generate the desired level of current.

DACS with NFET Hybrid Switched Current Cells

Figure 1B:
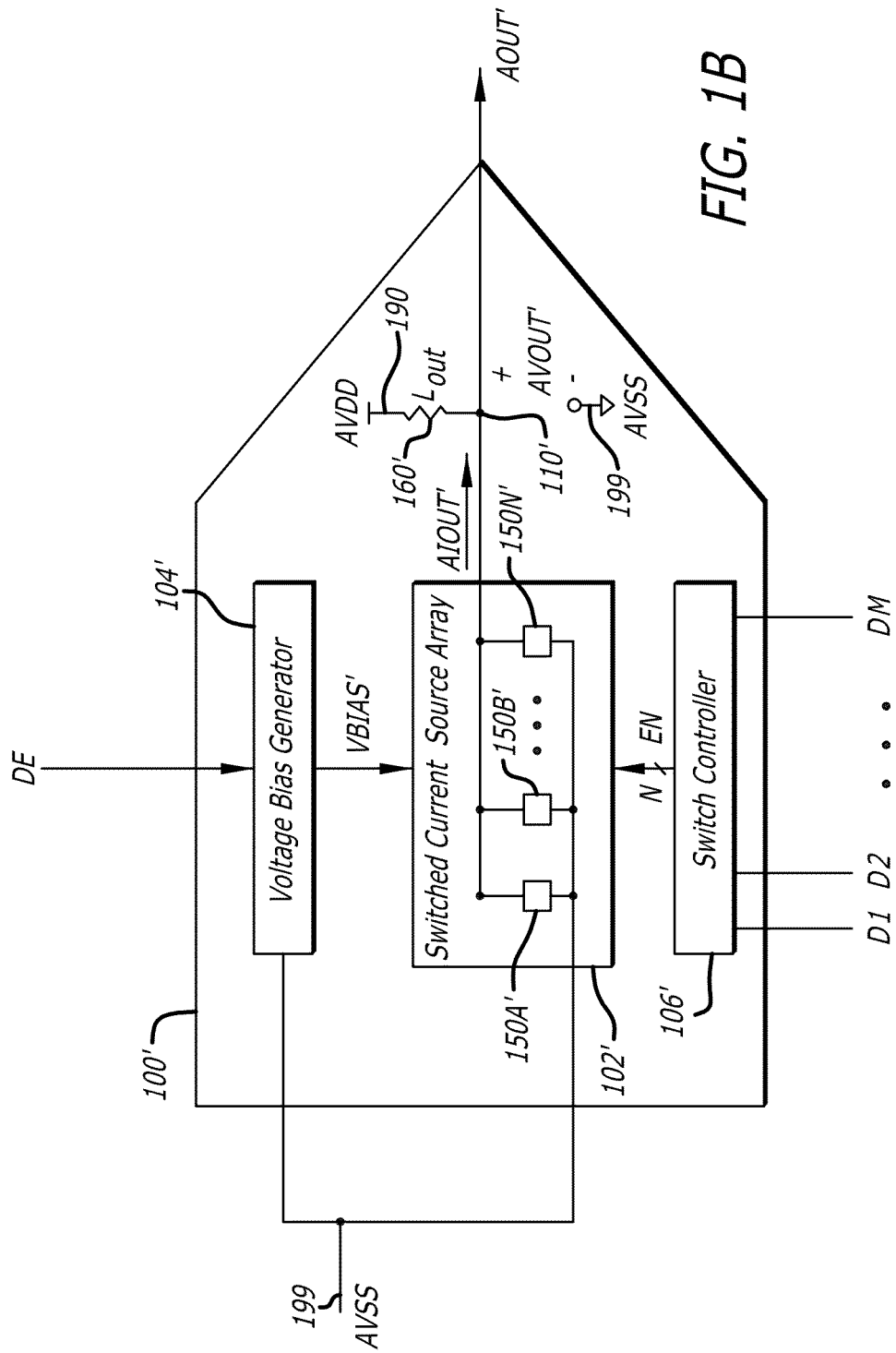
FIG. 1B is a functional block diagram of a digital to analog converter utilizing a plurality of hybrid switched current cells formed of N-channel transistors.

Referring now to FIG. 1B, a current switching DAC 100' is shown. The DAC 100' uses a plurality of hybrid switched current cells 150A'-150N' formed of N-channel transistors. The digital to analog convertor (DAC) 100' converts a digital input signal Din' of a plurality of M bits (Dl' through DM') at the input to a switch controller 106' into an analog output signal on an analog output terminal 110'. The current switching DAC 100' includes a switched current source array 102', a voltage bias generator 104', and a switch controller 106' coupled together as shown. The switched current source array 102' is coupled to the switch controller 106' and the bias voltage generator 104'. The DAC 100' may receive analog power supply voltages (AVDD,AVSS) and digital power supply voltages (VDD,VSS).

The switched current source array 102' includes a plurality of N hybrid switched cells 150A'-150N' where the value of N may be equal to two to the power of M less one (N=$2^M$−1). The plurality of N hybrid switched cells 150A'-150N' are coupled to the switch controller 106' to receive N enable signals (en1-enN). The plurality of hybrid switched cells 150A'-150N' are coupled to the bias voltage generator 104' to receive a bias voltage VBIAS. The plurality of hybrid switched cells 150A'-150N' have one terminal that is coupled together at the analog output terminal 110'. Another terminal of the plurality of hybrid switched cells 150A'-150N' is coupled together at a terminal of an analog voltage power supply AVDD 290'. The plurality of hybrid switched cells 150A'-150N' form the analog output signal (an analog current signal or an analog voltage signal) at the analog output terminal AOUT' 110' in response to the digital input signal Din'.

The switch controller 106' is coupled to the digital input signal Din' to receive the bits of the digital signal to convert into an analog signal. The switch controller 106' is typically coupled to the digital power supply (VSS,VDD) to generate the switch control signals for the switched current source array 102'. The switch controller 106' generates a plurality of digital switch control signals (enable-bar ENB for p-channel transistors or enable EN for n-channel transistors) in response to the digital input signal Din'.

The bias voltage generator 104' is coupled to a first terminal of the analog voltage power supply AVDD 190 and the plurality of hybrid switched cells 150A'-150N'. The bias voltage generator 104' is used to generate a bias voltage VBIAS' in response to the analog voltage power supply that is explained further herein with reference to FIGS. 3A-3B.

As mentioned previously, the switched current source array 102' includes a plurality of hybrid switched cells 150A'-150N'. Each of the plurality of hybrid switched cells 150A'-150N' include a drain switched transistor (also referred to herein as a current switching transistor because it selectively switches a current ON/OFF) in a leg of a circuit and a source switched transistor (also referred to herein as a voltage switching transistor because its selectively switches a power supply voltage ON/OFF) in a parallel leg of the circuit. Each of the current switching transistor and the voltage switching transistor has gate terminals coupled together and to a respective one of the plurality of digital enable signals. Each of the plurality of hybrid switched cells further includes a first biased current source transistor coupled to the current switching transistor. A current of the first biased current source transistor is selectively switched by the current switching transistor in response to the digital enable signal. Each of the plurality of hybrid switched cells further includes a second biased current source transistor coupled to the voltage switching transistor. A source voltage coupled into the second biased current source transistor is selectively switched by the voltage switching transistor in response to the digital enable signal.

The DAC 100' may optionally include an output load, for example, an output load Lout 160' coupled between the analog output terminal AOUT' 110' and a second terminal of the analog voltage power supply (e.g., AVSS 199). The output load Lout 160 may be a resistor that is used to generate an analog voltage output signal AVOUT' in response to the analog current output signal AIOUT' generated by the switched current source array 102'. Alternatively, the output load Lout 160 can be a complex circuit that is responsive to the analog current output signal AIOUT generated by the switched current source array 102.

Figure 2B:
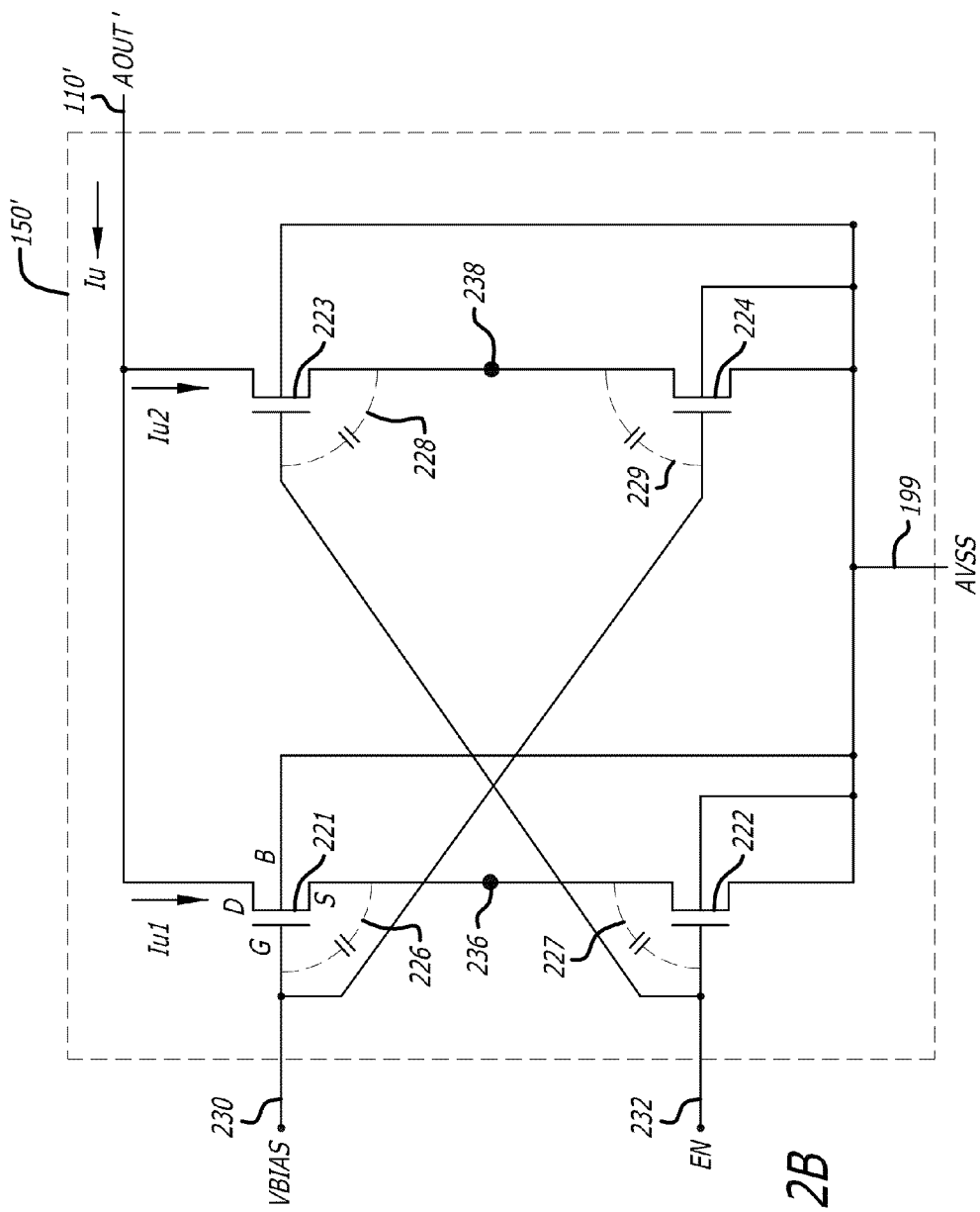
FIG. 2B is a schematic diagram of a hybrid switched current cell formed of N-channel transistors.

Referring now to FIG. 2B, a hybrid switched current cell 150' is formed of N-channel field effect transistors (NFETs) 221-224, each having a gate terminal (G), a source terminal (S), a drain terminal (D), and a bulk or substrate terminal (B). The hybrid switched current cell 150' is instantiated multiple times to form the plurality of hybrid switched current cells 150A'-150N' for the DAC 100'.

The hybrid switched current cell 150' includes a source switched series circuit coupled in parallel with a drain switched series circuit. The drain switched series circuit includes NFETs 223-224 coupled in series together. The source switched series circuit includes the NFETs 221-222 coupled in series together.

NFET 224 of the drain switched series circuit has a source terminal S coupled to the analog power supply voltage AVSS 199, a gate terminal G coupled to the bias voltage VBIAS 230, and a drain terminal D coupled to the source terminal S of the NFET 223. NFET 223 has a source terminal S coupled to the drain terminal D of the NFET 224, a gate terminal G coupled to the enable digital signal EN 232, and a drain terminal D coupled to the analog output terminal AOUT' 110'. The bulk or substrate terminal B of the NFETs 223-224 are coupled to the analog power supply voltage terminal AVSS 199.

NFET 222 of the source switched series circuit has a source terminal S coupled to the analog power supply voltage AVSS 199, a gate terminal G coupled to the enable digital signal EN 232, and a drain terminal D coupled to the source terminal S of the NFET 221. NFET 221 has a source terminal S coupled to the drain terminal D of the NFET 222, a gate terminal G coupled to the bias voltage VBIAS 230, and a drain terminal D coupled to the analog output terminal AOUT' 110'. The bulk or substrate terminal B of NFETs 221-222 are coupled to the analog power supply voltage terminal AVSS 199.

In the drain switched series circuit, the NFET 224 is biased by the bias voltage VBIAS 230 to provide a first portion of unit current (Iu1) of a current source in a bias circuit to the drain terminal D of the NFET 223. The NFET 223 is selectively switched ON by the enable digital signal EN 232 coupled to its gate terminal G. When selectively switched ON, the NFET 223 provides the first portion of unit current from the NFET 224 to the analog output terminal AOUT' 110' in response to the enable digital signal EN 232.

In the source switched series circuit, the NFET 222 is selectively switched ON by the enable digital signal EN 232 coupled to its gate terminal G. When selectively switched ON, the NFET 222 provides the analog power supply voltage AVSS 199 to the source terminal S of the NFET 221 in response to the enable digital signal EN 232. The NFET 221 is biased ON by the bias voltage VBIAS 230 coupled to its gate terminal G. The NFET 221 selectively provides a second portion of unit current (Iu2) of the current source in the bias circuit to the analog output terminal AOUT' 110' in response to receiving the analog power supply voltage AVSS from the drain terminal D from the NFET 222.

When switched ON by the enable signal EN, the first portion of unit current (Iu1) from the drain switched series circuit and the second portion of unit current (Iu2) from the source switched series circuit that are coupled together are summed together at analog output node 110' out of the hybrid cell 150' to form a full unit of current (Iu) pulled into the cell.

The channel lengths of the NFETS 221-224 of the hybrid switched current cell 150 are usually of equal size. The widths of the NFET 221 and NFET 224 may be equal, and similarly, the widths of the NFET 222 and NFET 223 may be equal such that the first portion of unit current (Iu1) and the second portion of unit current (Iu2) are approximately equal. Each of the first portion of unit current and the second portion of unit current are about one half unit of current such that a full unit of current (Iu) is formed at the analog output node 110'.

The hybrid switched current cell 150' may be enhanced by altering the equal width sizing of transistors between the source switched series circuit and the drain switched series circuit. The widths (and/or lengths) of the transistors in the source switched series circuit may be a ratio to the widths (and/or lengths) of the transistors in the drain switched series circuit.

The charge injection on VBIAS contributed by NFET 221 and PFET 224 is complimentary but not equal. The net difference of injection manifests as a disturbance (a glitch or spike) in the voltage on VBIAS 230. The sizing and ratio of the NFET 221 and the NFET 224 affects the net charge injection on the net VBIAS 210. By carefully choosing the ratio of sizes between the NFET 221 to the NFET 224 the net charge injected to VBIAS 230 can be minimized, and hence reduce the memory effect or distortion at the output.

The width of the NFET 224 to the width of the NFET 221 may be a ratio greater than one in the hybrid switched current cell 150'. For example, the width of NFET 224 may be twice the width of NFET 221. Accordingly to this example, the drain switched series circuit may switch approximately two-thirds of the unit current while the source switched series circuit may approximately switch one-third of the unit current such that a full unit of current (Iu) is formed at the analog output node 110'.

Figure 3B:
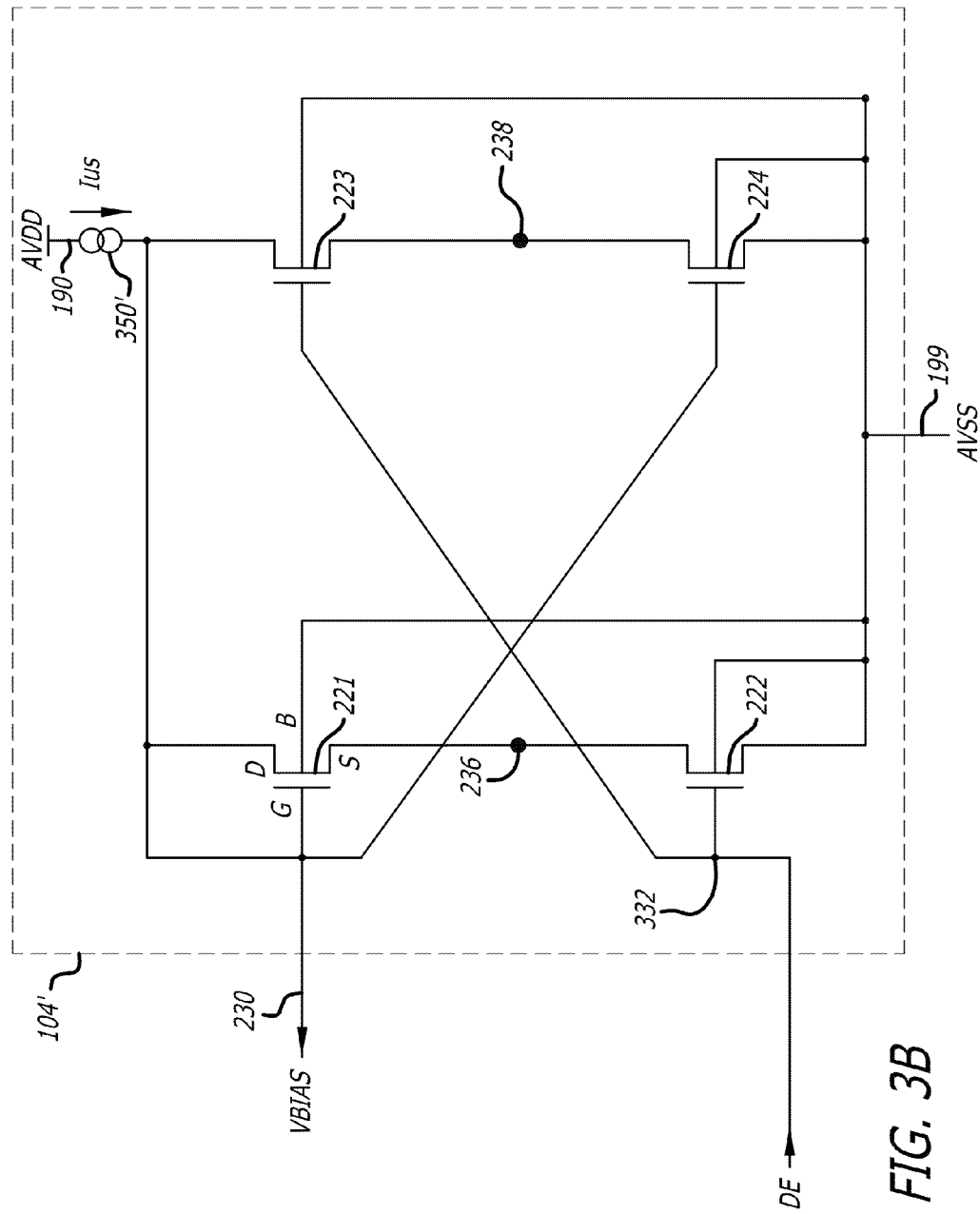
FIG. 3B is a schematic diagram of a bias voltage generator circuit for the DAC of FIG. 1B and the hybrid switched current cell of FIG. 2B.

Referring now to FIG. 3B, a voltage bias generator circuit 104' is illustrated. The voltage bias generator circuit 104' has the same configuration of NFET transistors 221-224 as found in the hybrid switched current cell 150' but with some terminals coupled differently as shown. The voltage bias generator circuit 104' further includes a DAC enable signal DE 332 coupled to the gates G of the NFETs 221-224 to selectively turn the bias generator ON and OFF. The voltage bias generator circuit 104' further includes a current source 350' that generates the source current (Ius) that may be mirrored by the hybrid cell 150' as the unit of current (Iu) from the cell.

The voltage bias generator circuit 104' includes a first series circuit including NFETs 223-224 coupled in series together and a second series circuit including NFETs 221-222 coupled in series together. The first series circuit and the second series circuit are coupled in parallel between the analog power supply AVSS 199 and node 230.

The gate terminals G of the NFET 224 and NFET 221 are coupled together and to the bias voltage output terminal VBIAS 230. The drain terminals D of the NFET 223 and NFET 221 are coupled together and to the bias voltage output terminal VBIAS 230. This sets up the NFET 221 into a diode configuration with its gate terminal G and drain terminal D coupled together. When enabled by the DAC enable signal DE, the NFET 224 is effectively configured into a diode configuration with its gate terminal and drain terminal D coupled together through the source-drain resistance of NFET 223.

The gate terminals G of the NFET 223 and NFET 222 are coupled together and selectively controlled by a DAC enable signal DE 332 to turn the bias generator ON/OFF. It is desirable to turn the bias generator OFF to control leakage in a powered down mode. To turn the bias voltage generator 104' ON, the DAC enable signal DE is driven to a logical high turning ON the NFET 223 and NFET 222 and the voltage bias generator circuit 104 so that it generates the bias voltage VBIAS. To turn the bias voltage generator 104' OFF, the DAC enable signal DE is driven to a logical low. In this case, the NFET 222 and NFET 223 are both turned OFF, the voltage bias generator circuit 104' is powered down, and current does not leak through the current source 350'.

The current source 350' has one terminal coupled to the bias voltage output terminal VBIAS 230 and another terminal coupled to the analog power supply voltage AVSS 350. The current source 350' may be formed in a number of well known ways to form the reference current Ius. The current source 350' may be formed by a simple resistor or a more complex current source circuit.

Referring now to FIG. 4B, a schematic diagram of an exemplary current source 350P' is shown. The exemplary current source 350P' may be used with the bias voltage generator circuit 104' as the current source 350'. Other known current sources may alternatively be used.

The exemplary current source 350P' is a passive current source formed by a resistor Rbias coupled between the upper analog voltage power supply terminal AVDD 190 and the bias voltage terminal 230. FIG. 4C described herein, illustrates an exemplary active current source for the bias voltage generator 104 shown in FIG. 3A. An active current source may also be used for the bias voltage generator 104'. Those of ordinary skill in the art will recognize how to modify the active current source shown in FIG. 4C for the bias voltage generator 104' shown in FIG. 3B.

Performance Improvement

Figure 6:
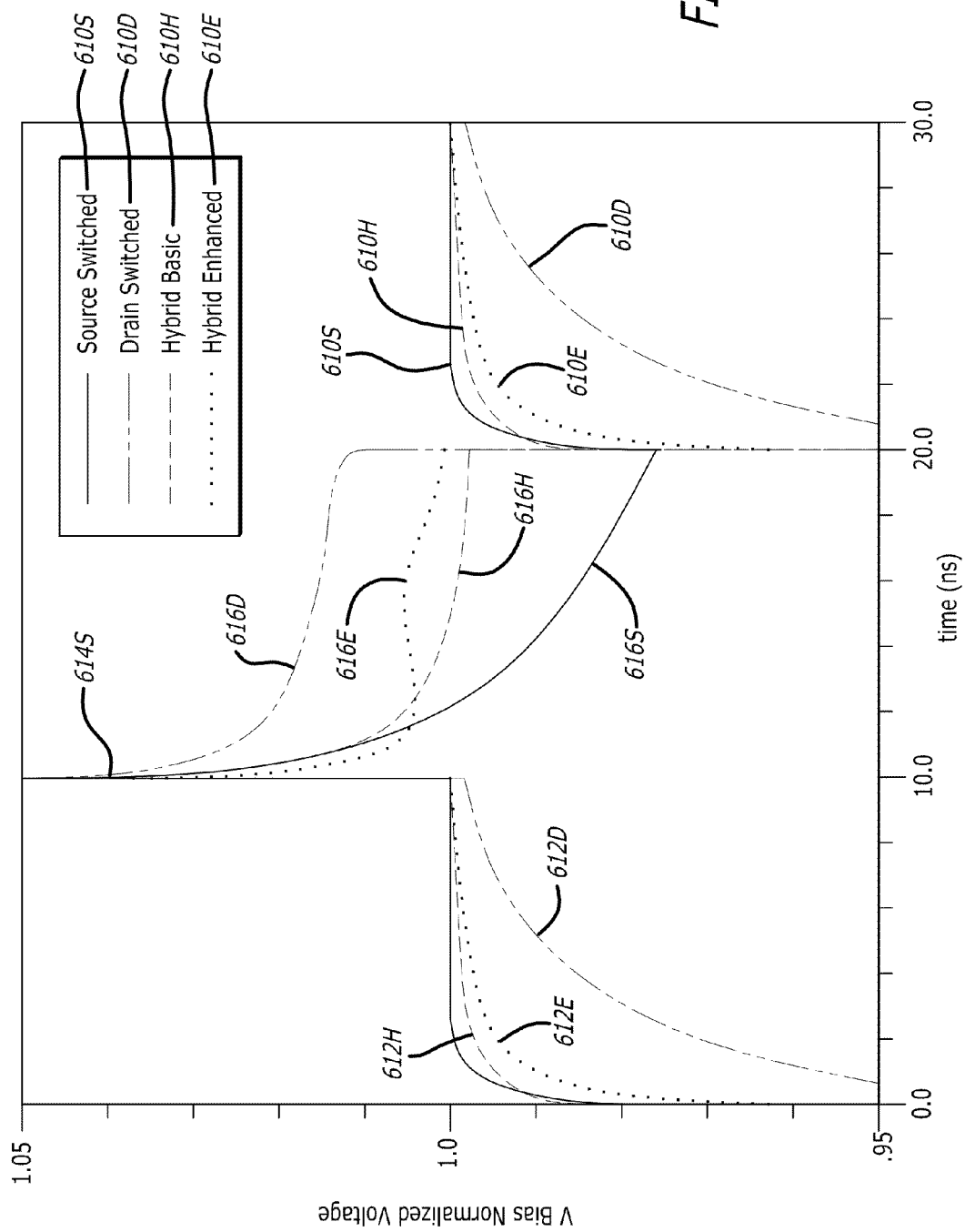
FIG. 6 illustrates voltage waveform diagrams of bias voltage of an ON-OFF-ON sequence for a source switched current cell, a drain switched current cell, a hybrid switched current cell, and an enhanced hybrid switched current cell with transistor size (e.g., width and/or length) being adjusted to further improve compensation.

Referring now to FIG. 5, a graph of normalized current (Y-axis) I versus time (X-axis) in nanoseconds is shown for various DAC current switching cell types for nominal semiconductor parameters, voltage, and temperature at a high frequency. FIG. 6 illustrates a corresponding graph of normalized bias voltage (Y-axis) VBIAS versus time (X-axis) corresponding to an ON-OFF-ON sequence of the various DAC current switching cell types for nominal semiconductor parameters, voltage, and temperature at a high frequency.

Referring momentarily to FIGS. 2A and 5, a source switched current curve 510S represents the current switching performance of a source switched DAC cell comprising only of PFETs 203-204 between AVDD 190 and AOUT 110, without PFETs 201-202. A drain switched current curve 510D represents the current switching performance of a source switched DAC cell comprising only of PFETs 201-202 between AVDD 190 and AOUT 110, without PFETs 203-204. A hybrid switched current curve 510H represents the current switching performance of the hybrid switched current cell comprising of PFETs 201-202 and PFETs 203-204 between AVDD 190 and AOUT 110. An enhanced hybrid switched current curve 510E represents the current switching performance of the enhanced hybrid switched DAC cell comprising of PFETs 201-202 and PFETs 203-204 between AVDD 190 and AOUT 110, with the PFETs 201-202 and PFETs 203-204 being sized to provide enhanced performance.

At high frequencies for the switching rate of the EN or ENB signal of the DAC cell, relative to the technology of choice (e.g., twenty nanosecond period or less), effects such as charge injection and charge accumulation occurs around the transistors of the DAC cell that can lead to a signal distortion referred to as a memory effect. The memory effect in the DAC cell from the charge injection and charge accumulation can distort the output current profile of a current switching DAC. Point 512D on the drain switched curve 510D (in comparison with points 512S,512H,512E on curves 510S, 510H,512E) illustrates the exemplary distortion in the current output due to the memory effect for a single drain switched circuit cell when switched ON and switching at a frequency of about one hundred mega-Hertz (MHz). If it is desirable to have even higher switching rates (e.g., five nanosecond period or two hundred MHz) for the EN or ENB signal of the DAC cell, the memory effect for the single drain switched DAC circuit cell becomes even more pronounced. Accordingly, DACs that have only drain switched current cells have been typically limited to lower frequencies to avoid such memory effects.

As shown by the source switched curve 512S in FIG. 5, a source switched DAC circuit cell is less prone to the memory effect. However, it can be shown from simulations that the output current form the source switched DAC circuit cell has glitches (see point 514S on curve 510S) and is rather sensitive to process variations, particularly when being switched off at high frequency rates. The hybrid switched DAC current cell is much less sensitive to variations in process, voltage, and temperature than the source switched DAC circuit cell.

Referring to FIG. 2A, the hybrid switched current cell 150 has parasitic gate-to-source capacitors 207,209 and parasitic gate-to-drain capacitors 206,208 around PFETs 201-204. Ignoring the source switched series circuit, the parasitic capacitors 206-207 can contribute to the charge injection and charge accumulation in the drain switched series circuit. Ignoring the drain switched series circuit, the parasitic capacitors 208-209 can contribute to the charge injection and charge accumulation in the source switched series circuit.

In the drain switched series circuit shown in FIG. 2A, the gate-drain parasitic capacitor 206 between node 216 and VBIAS 210 around PFET 201 can contribute to charge injection into the bias voltage VBIAS 120. When the enable-bar ENB signal switches from a logical high level to a logical low level, PFET 202 switches from OFF to ON (switch is closed) and current Iu1 flows through PFETs 201-202, such as shown by point 512D of the curve 510D shown in FIG. 5. The voltage at node 216 can swing from a voltage level of AVDD to a lower voltage of a pull down voltage VPD. The pull down voltage VPD is approximately a transistor threshold voltage above the voltage on the analog output node AOUT 110. The voltage excursion on the node 216 injects a corresponding charge into the bias voltage VBIAS 210 at the gate G of the PFET 210 due to the parasitic capacitor 206.

Ignoring the complementary source switch series circuit coupled in parallel, when PFET 202 is switched from OFF to ON, the charge injection temporarily pulls down on the bias voltage VBIAS, such as shown by point 612D on the curve 610D in FIG. 6, for example. The temporary change in the bias voltage VBIAS, causes a momentary increase in the current Iu1 through the PFET 202 such as shown by point 512D on curve 510D in FIG. 5. With fast switching speeds, the charges can accumulate and further displace the VBIAS signal, which results in the greater memory effect. When PFET 202 is switched from ON to OFF, charge injection pushes quickly up on the bias voltage VBIAS causing a momentary decrease in the current Iu1 through the PFET 202.

In the sourced switch series circuit, a coupling effect of the gate to source capacitor 209 of the PFET 204 between node 218 and VBIAS 210 of the hybrid switched current cell can also contribute to charge injection into the bias voltage VBIAS 120. With PFET 203 turned OFF (switch is open), no current flows through PFET 204 and the voltage at node 218 is the pull down voltage VPD applied to terminal AOUT 110.

When the enable-bar ENB signal switches from a logical high level to a logical low level, PFET 203 is switched from OFF to ON (switch is closed) and current Iu2 flows through PFETs 203-204, such as shown by point 512S of the curve 510S shown in FIG. 5. The PFET 203 when turned ON couples the upper analog supply voltage AVDD 190 to the node 218. Accordingly, the voltage at node 218 can swing up from a lower pull down voltage VPD towards the upper voltage level of AVDD. When PFET 203 is switched ON, it is expected that the voltage at node 218 would settle to approximately the voltage level of AVDD 190. This voltage excursion on the node 218 injects a corresponding charge into the bias voltage VBIAS 210 at the gate G of the PFET 204 due to the parasitic capacitor 209.

Ignoring the complementary drain switched series circuit coupled in parallel, when PFET 203 is switched from OFF to ON, the charge injection pulls up on the bias voltage VBIAS. The increase in the bias voltage VBIAS, causes a momentary decrease in the current Iu2 through the PFET 204. When PFET 203 is switched from ON to OFF, charge injection pulls down on the bias voltage VBIAS causing a momentary increase in the current Iu2 through the PFET 204, such as shown by point 514S on the curve 510S.

With the source switched series circuit and drain switched series circuit coupled in parallel together in the hybrid switched current cell of the DAC, compensation can occur to reduce the effects of charge injection and charge accumulation onto VBIAS so that memory effect is reduced and performance of the circuit is improved.

During the switching of OFF to ON of the PFETs 202-203 of the hybrid switched current cell, the complimentary effects of the source switched series circuit and the drain switched series circuit, results in a smaller net charge injected to the bias voltage VBIAS terminal. Accordingly, there is a smaller voltage change on the bias voltage VBIAS. This reduced net charge injection effect reduces the non-linear current scaling effect (or memory effect) when switching at high speeds.

In FIG. 2B, the hybrid switched current cell 150' also has parasitic gate-to-source capacitors 226,228 and parasitic gate-to-drain capacitors 227,229 around NFETs 221-224. The source switched series circuit and drain switched series circuit coupled in parallel together in the hybrid switched current cell of the DAC, can similarly compensate to reduce the effects of charge injection and charge accumulation.

It has been determined that a hybrid switched current cell, such as the hybrid switched current cell 150,150' shown in FIGS. 2A-2B, can be used to compensate for the memory effect in the drain switched current cell and to compensate for the glitches and the process variation effects of the source switched current cell.

The hybrid switched current cell when used in a DAC has a number of advantages over prior current switching cells. The hybrid switched current cell has a lower memory effect across process, voltage, and temperature variations so that it has improved high-speed behavior (i.e. less charge accumulation) so that it can be switched faster. For a given current density per cell, the area of the hybrid switched current cell may be about the same as the prior current cells that are used in the DAC. Even though an additional transistor is switching, power consumption of the hybrid switched current cell is no greater so that there is no power penalty when employing the hybrid switched current cell in a DAC.

CONCLUSION

While this specification includes many specifics, these should not be construed as limitations on the scope of the disclosure or of what may be claimed, but rather as descriptions of features specific to particular implementations of the disclosure. Certain features that are described in this specification in the context of separate implementations may also be implemented in combination in a single implementation. Conversely, various features that are described in the context of a single implementation may also be implemented in multiple implementations, separately or in sub-combination. Moreover, although features may be described above as acting in certain combinations and even initially claimed as such, one or more features from a claimed combination may in some cases be excised from the combination, and the claimed combination may be directed to a sub-combination or variations of a sub-combination. Accordingly, the claimed invention is limited only by patented claims that follow below.

What is claimed is:

1. An apparatus for converting a digital input signal into an analog output signal, the apparatus comprising:
a first biased transistor coupled to an analog power supply voltage and a bias voltage, the first biased transistor to selectively couple a first portion of unit current of a current source;
a first switched transistor coupled to the first biased transistor, an analog output terminal, and one or more bits of a digital input signal, the first switched transistor to selectively couple the first portion of unit current of the current source into the analog output terminal in response to one or more bits of the digital input signal;
a second switched transistor coupled to the analog power supply voltage and the one or more bits of the digital input signal;
a second biased transistor coupled to the second switched transistor, the bias voltage, and the analog output terminal;
wherein the second switched transistor selectively couples the analog power supply voltage to the second biased transistor in response to the one or more bits of the digital input signal; and
wherein the second biased transistor couples a second portion of unit current of the current source into the analog output terminal in response to receiving the analog power supply voltage from the second switched transistor.

2. The apparatus of claim 1, wherein
the first portion of unit current and the second portion of unit current are summed together at the analog output terminal to form a full portion of unit current at the analog output terminal.

3. The apparatus of claim 1, wherein
the analog power supply voltage is a positive analog power supply voltage, and
the first biased transistor, the first switched transistor, the second biased transistor, and the second switched transistor are P-channel field effect transistors each having a bulk terminal coupled to the positive analog power supply voltage.

4. The apparatus of claim 1, wherein
the analog power supply voltage is a negative analog power supply voltage, and
the first biased transistor, the first switched transistor, the second biased transistor, and the second switched transistor are N-channel field effect transistors each having a bulk terminal coupled to the negative analog power supply voltage.

5. The apparatus of claim 1, wherein
transistor sizes of the first biased transistor and the second biased transistor are ratioed to further compensate for charge injection and memory effect.

6. The apparatus of claim 5, wherein
channel lengths of the first biased transistor, the first switched transistor, the second biased transistor, and the second switched transistor are equal;
a ratio of the widths of the second biased transistor to the first biased transistor is greater than one.

7. The apparatus of claim 1, further comprising:
a bias voltage circuit coupled to the first biased transistor and the second biased transistor, the bias voltage circuit to generate the bias voltage in response to a unit current source.

8. The apparatus of claim 7, further comprising:
a switch controller coupled to the first switched transistor and the second switched transistor, the switch controller further coupled to the one or more bits of the digital input signal, the switch controller to generate a switch control signal to switch ON and OFF the first switched transistor and the second switched transistor in response to the one or more bits of digital input signal.

9. The apparatus of claim 2, further comprising:
an output load coupled to the analog output terminal.

10. The apparatus of claim 9, wherein
the output load is a resistor to convert an analog output current including the unit current into an analog output voltage.

11. An apparatus for converting a digital signal into an analog signal, the apparatus comprising:
a first series circuit having a first transistor coupled in series to a second transistor,
wherein the first transistor in the first series circuit has a source terminal coupled to an analog power supply voltage terminal, a gate terminal coupled to a bias voltage terminal, and a drain terminal, and
wherein the second transistor in the first series circuit has a source terminal coupled to the drain terminal of the first transistor, a gate terminal coupled to an enable digital signal, and a drain terminal coupled to an analog output terminal;
and
a second series circuit coupled in parallel to the first series circuit, the second series circuit having a third transistor coupled in series to a fourth transistor,
wherein the third transistor has a source terminal coupled to the analog power supply voltage terminal, a gate terminal coupled to the enable digital signal, and a drain terminal,
wherein the fourth transistor has a source terminal coupled to the drain terminal of the third transistor, a gate terminal coupled to the bias voltage terminal, and a drain terminal coupled to the analog output terminal;
wherein the first transistor is biased by a bias voltage from the bias voltage terminal to couple a first portion of unit current of a current source to the drain terminal of the second transistor;

the second transistor selectively couples the first portion of unit current to the analog output terminal in response to the enable digital signal;

the third transistor selectively couples the analog power supply voltage from the analog power supply voltage terminal to the source terminal of the fourth transistor in response to the enable digital signal; and the fourth transistor is biased by the bias voltage from the bias voltage terminal to selectively couple a second portion of unit current of the current source to the analog output terminal in response to selectively receiving the analog power supply voltage through the third transistor.

12. The apparatus of claim 11, wherein
the first portion of unit current and the second portion of unit current are summed together at the analog output terminal to form a full portion of unit current.

13. The apparatus of claim 11, wherein
the analog power supply voltage is a positive analog power supply voltage, and
the first, second, third, and fourth transistors are P-type channel transistors each having a bulk terminal coupled to the positive analog power supply voltage.

14. The apparatus of claim 11, wherein
the analog power supply voltage is a negative analog power supply voltage, and
the first, second, third, and fourth transistors are N-type channel transistors each having a bulk terminal coupled to the negative analog power supply voltage.

15. The apparatus of claim 11, wherein
transistor sizes of the first transistor and the fourth transistor are ratioed to further compensate for charge injection and memory effect.

16. The apparatus of claim 15, wherein
the channel lengths of the first, second, third, and fourth transistors are equal;
a ratio of the widths of the fourth transistor to the first transistor is greater than one.

17. A digital to analog convertor (DAC) for converting a digital input signal into an analog output signal, the DAC comprising:
a switch controller coupled to a digital input signal, the switch controller to generate a plurality of digital enable signals in response to the digital input signal;
a bias voltage generator coupled to a first terminal of an analog voltage power supply, the bias voltage generator to generate a bias voltage in response to the analog voltage power supply; and
a switched current source array coupled to the switch controller and the bias voltage generator, the switched current source array including a plurality of hybrid switched cells coupled to the switch controller and the bias voltage generator, the plurality of hybrid switched cells coupled together at an analog output terminal, the plurality of hybrid switched cells to form an analog output current signal at the analog output terminal in response to the digital input signal,
wherein each of the plurality of hybrid switched cells includes
a drain switching transistor to switch a first portion of unit current ON and OFF in response to a respective one of the plurality of digital enable signals,
a source switching transistor to switch a second portion of unit current ON and OFF in response to the respective one of the plurality of digital enable signals, and
a gate of the drain switching transistor coupled to a gate of the source switching transistor and coupled to the respective one of the plurality of digital enable signals.

18. The DAC of claim 17, wherein
the first portion of unit current and the second portion of unit current are summed together at the analog output terminal to form a full portion of unit current of the analog output current signal.

19. The DAC of claim 17, wherein
each of the plurality of hybrid switched cells further includes
a first biased current source transistor coupled to the drain switching transistor, wherein a current of the first biased current source transistor being selectively switched by the drain switching transistor in response to the respective one of the plurality of digital enable signals; and
a second biased current source transistor coupled to the source switching transistor, wherein a source voltage to the second biased current source transistor being selectively switched by the source switching transistor in response to the respective one of the plurality of digital enable signals.

20. The DAC of claim 17, further comprising:
an output load coupled between the analog output terminal and a second terminal of the analog voltage power supply.

21. The DAC of claim 20, wherein
the output load is a resistor to generate an analog voltage output signal in response to the analog current output signal.

* * * * *